United States Patent
Suzuki et al.

(10) Patent No.: US 7,046,612 B2
(45) Date of Patent: May 16, 2006

(54) DRIVE CURRENT SUPPLY CIRCUIT WITH CURRENT MIRROR

(75) Inventors: Takashi Suzuki, Hamamatsu (JP); Seiichiro Mizuno, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 399 days.

(21) Appl. No.: 10/084,341

(22) Filed: Feb. 28, 2002

(65) Prior Publication Data

US 2002/0118629 A1    Aug. 29, 2002

(30) Foreign Application Priority Data

Feb. 28, 2001    (JP)    ............................ P2001-055929

(51) Int. Cl.
*G11B 7/00*    (2006.01)
(52) U.S. Cl. ...................................... 369/116; 369/118
(58) Field of Classification Search ................ 369/116, 369/118

See application file for complete search history.

(56) References Cited

U.S. PATENT DOCUMENTS

| | | | |
|---|---|---|---|
| 4,706,252 A * | 11/1987 | Egawa et al. | ............. 372/38.03 |
| 4,799,224 A | 1/1989 | Bottacchi et al. | |
| 4,819,241 A | 4/1989 | Nagano | |
| 5,185,538 A | 2/1993 | Kondoh et al. | |
| 5,276,671 A * | 1/1994 | Minami et al. | ............. 369/116 |
| 5,438,581 A | 8/1995 | Reele | |
| 5,629,913 A * | 5/1997 | Kaku et al. | ............... 369/47.52 |
| 5,822,346 A * | 10/1998 | Arai | ........................ 372/38.04 |
| 5,880,582 A | 3/1999 | Sawada | |
| 5,898,334 A | 4/1999 | Fairgrieve | ..................... 37/411 |
| 6,496,525 B1 * | 12/2002 | Kimura | ................... 372/38.02 |
| 6,516,015 B1 * | 2/2003 | Kimura | ................... 372/38.02 |
| 6,587,489 B1 * | 7/2003 | Schrodinger | ............. 372/29.01 |

FOREIGN PATENT DOCUMENTS

| | | |
|---|---|---|
| EP | 0 342 814 A | 11/1989 |
| EP | 0 929 022 A | 7/1999 |
| EP | 1 003 256 A | 5/2000 |
| JP | 7-31823 | 4/1995 |

OTHER PUBLICATIONS

Image: Intenational graphic symbols of current source.png; Wikimedia Commons; pp. 1-2.*

* cited by examiner

*Primary Examiner*—Gautam R. Patel
(74) *Attorney, Agent, or Firm*—Drinker Biddle & Reath LLP

(57) ABSTRACT

A drive current supply circuit is provided in which the speed of rise of the drive current to a laser diode is increased. In a drive current supply circuit for supplying drive current I to load 50 connected with the line 1R of two parallel lines 1R and 2R of a first current mirror circuit 1, this drive current supply circuit is provided with a control circuit CONT that controls the current i flowing in the other line 1L in accordance with first control signal Σø1 and the first control signal Σø1 comprises a steady DC component øD and a drive signal component ø1 added to the DC component øD when desired.

3 Claims, 6 Drawing Sheets

DRIVE CURRENT SUPPLY CIRCUIT WITH CURRENT MIRROR

BACKGROUND OF THE INVENTION

1. Field of the Invention

The present invention relates to a drive current supply circuit.

2. Description of the Related Art

Drive current supply circuits have been developed for laser diodes in optical pickups. Prior art drive current supply circuits are disclosed in published Japanese Patent No. H. 7-31823 and U.S. Pat. No. 5,898,334. The drive current to the laser diode in an optical pickup is different during writing to the storage medium and during reading, being set to a larger value during writing. The drive current supply circuits described above are effective when the drive current is to be made variable.

SUMMARY OF THE INVENTION

However, in the conventional drive current supply circuits, when the drive current of the laser diode is increased when writing to the storage medium, the speed of its rise is low, leading to the problem that, when reading and writing are repeated, high-speed writing cannot be performed. In light of the foregoing, an object of the present invention is to provide a drive current supply circuit wherein the speed of rise of the drive current to the laser diode constituting the load can be increased.

In order to solve the problem described above, a drive current supply circuit according to the present invention that supplies drive current to a load connected with one of the lines of a first current mirror circuit having two parallel lines comprises a control circuit that controls the current flowing in the other of the lines in accordance with a first control signal (the potential of the other line) so that the first control signal consists of a steady DC component and a drive signal component added to this DC component when desired.

That is, the DC component is applied to the line when reading data from an optical disk such as CD-R, CD-RW, DVD-R or DVD-RW, and the drive signal component is applied to the line when writing data on the optical disk. The drive signal component may be a signal modulated by using eight to fourteen modulation (EFM). The DC and drive signal component may be modulated by high frequency.

It is known that a current mirror circuit comprises two transistors and has two parallel lines. The current flowing through one line is equal to or proportional to the current flowing through the other line. Consequently, if the current flowing through the other line is controlled, the current flowing through the load connected to the one line can be controlled. This control is performed in accordance with a first control signal.

A transistor has a threshold voltage at which current starts to flow. When voltage of above this threshold is applied between the control terminals of the transistor i.e. between the base/emitter in the case of a bipolar transistor or between the source/gate in the case of a field-effect transistor, current flows in the transistor and current therefore flows in the load.

In a conventional control circuit that outputs such a control signal, this first control signal consists solely of a DC component during reading and consists solely of an AC component during writing. Consequently, in the control circuit, the conventional AC signal during writing constitutes the drive signal and when the current flowing through the other line is controlled in accordance with the magnitude of this, the voltage between the control terminals starts to rise from 0 V and so can only reach the desired voltage level after passing through this threshold voltage.

In contrast, in the drive current supply circuit of the present invention, since the first control signal comprises a steady DC component and a drive signal component added to this DC component when desired i.e. during writing, the voltage between the control terminals has already reached a certain level, due to this DC component, so the amount of variation for this to reach the drive signal component is smaller, so the rise time is shorter.

For the sake of this DC component, the level to which the voltage between the control terminals is to be raised can be determined as required. When this drive current supply circuit is employed in reading and writing by an optical pickup, during reading, it sets the DC component at or above the threshold voltage of the transistor and during writing a drive signal component increment is superimposed on this, so a voltage of at or above the threshold voltage of the transistor is of course set between the control terminals and, when writing, a large drive current flows to the load i.e. the laser diode through one of the parallel lines in the current mirror circuit.

The word "steady" means a continuous period in which there is no change whether in the reading period or in the writing period; it does not mean that the DC component does not change when the power source of the drive current supply circuit itself is OFF or when other control is being performed.

As described above, when the load is a laser diode, this drive current supply circuit can be utilized in an optical pickup.

The current mirror circuits could also be constructed of bipolar transistors, but, from the point of view of reducing power consumption, preferably consist of field-effect transistors.

In this case, the first current mirror circuit may comprise two field-effect transistors with their gates connected in common, one channel of the field-effect transistors being the one of the lines, the other channel of the field-effect transistors being the other of the lines, the DC voltage applied to the gate being the DC component of the first control signal and the drive voltage applied to the gate being the drive signal component of the first control signal.

When the gate/source voltage in the field-effect transistors is controlled i.e. when DC voltage or drive voltage is applied by the control circuit, the current flowing in the other line of the current mirror circuit changes depending on this first control signal. Since, as described above, the first control signal is set such that the rise during writing is speeded up, the rise of the drive current supplied to the load is speeded up.

Also, by preparing a plurality of current mirrors of the same construction as ascribed above and forming a node by connecting all of the one sides of the respective parallel lines, the load being connected with this node, the currents flowing through the other side of the parallel lines of each of the current mirror circuits are added. Consequently, the current flowing to the load can be controlled as the sum of these by individually controlling by means of the control circuit the currents that flow through the other sides of the parallel lines of the current mirror circuits.

Specifically, the drive current supply circuit in this case may further comprise at least a second current mirror circuit having two parallel lines, the one of the lines of the second current mirror circuit being connected with the load and wherein the control circuit controls the current flowing through the other of the lines of the second current mirror circuit in accordance with a second control signal, the second control signal comprising a steady DC component and, when desired, a drive signal component added to this DC component.

DESCRIPTION OF THE PREFERRED EMBODIMENTS

A drive current supply circuit according to an embodiment is described below. Identical elements are given the same reference symbols to avoid duplicated description.

Figure 1A:
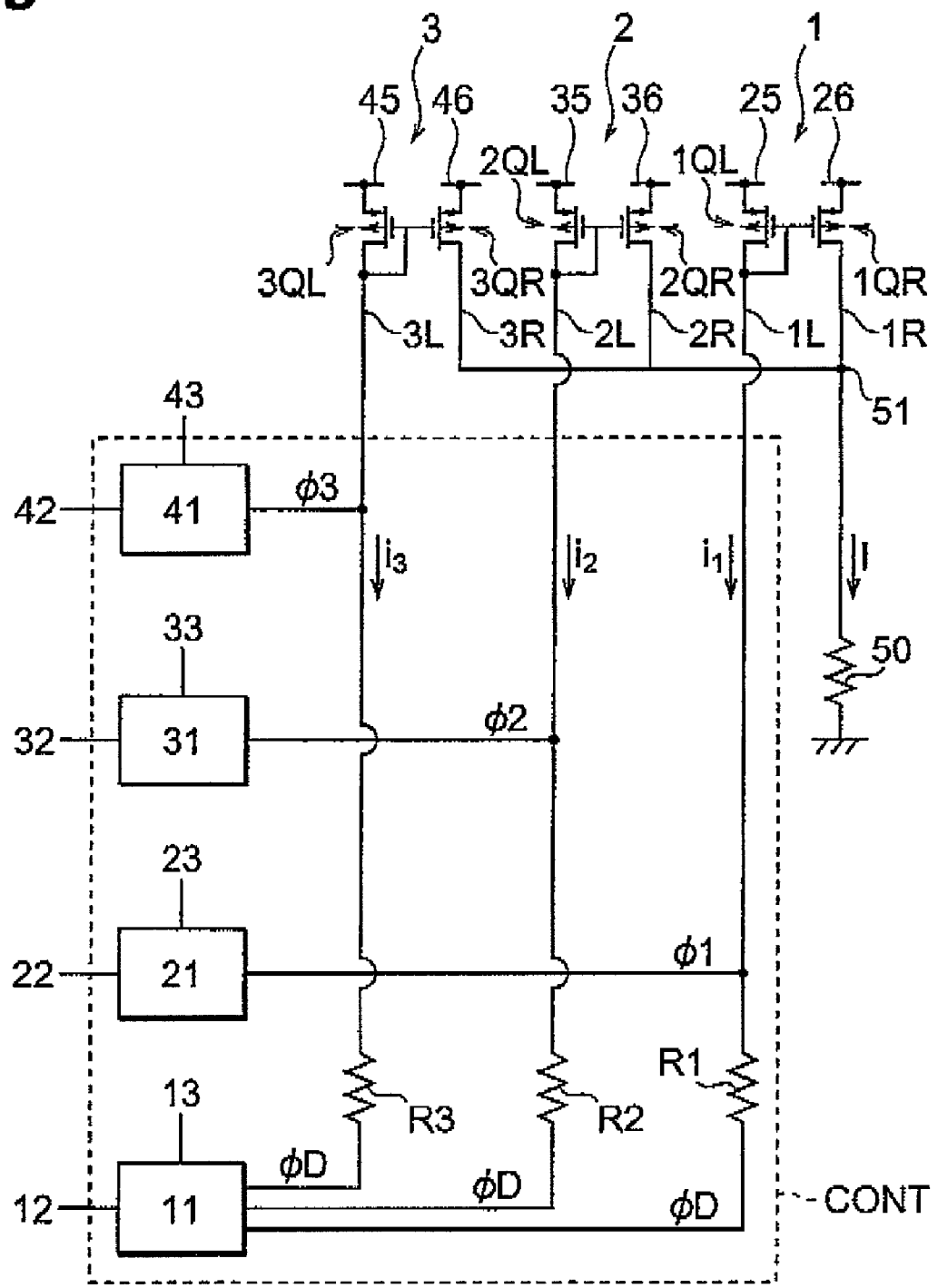
FIG. 1A is a circuit diagram of a drive current supply circuit according to an embodiment.
Figure 1B:
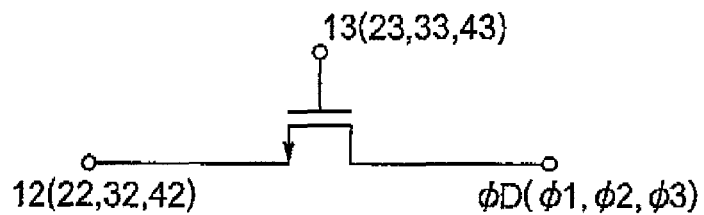
FIG. 1B is a circuit diagram of one of control circuits 11 to 41 shown in FIG. 1A.

FIG. 1A is a circuit diagram of a drive current supply circuit according to an embodiment and FIG. 1B is a circuit diagram of one of control circuits 11 to 41 shown in FIG. 1A. In a drive current supply circuit wherein a drive current is applied to a load 50 connected with one side (1R) of the lines of the first current mirror circuit 1 provided with two parallel lines 1R, 1L, this drive current supply circuit comprises a control circuit CONT that controls the current i flowing in an other-side one (1L) of the lines, in accordance with a first control signal $\Sigma\o1$. The load 50 is a laser diode.

This first control signal $\Sigma\o1$ consists of a steady DC component $\o D$ and a drive signal component $\o1$ obtained by adding the increment $\Delta\o1$ of the drive signal component to the DC component $\o D$ when desired. It should be noted that "adding" is not restricted to addition of physical quantities which are both of positive sign.

This first control signal $\Sigma\o1$ is the potential of the gate of current mirror circuit 1. The DC component $\o D$ is applied to the line via resistance R1 when reading data from an optical disk such as CD-R, CD-RW, DVD-R or DVD-RW, and the drive signal component $\o1$ is applied to the line during writing data to the optical disk. The drive signal component may be a signal modulated by using eight to fourteen modulation (EFM). The DC signal component and drive signal component may be modulated by high frequency.

DVD requires 650 nm wavelength laser light for reading data, and CD requires 780 nm wavelength laser light for reading data. So, if the load 50, laser diode is applied to DVD/CD compatible player, the laser diode is comprised of two laser diodes, the respective diodes emitting 650 nm and 780 nm wavelength laser light, respectively.

Current mirror circuit 1 comprises two transistors 1QR, 1QL and is provided with two parallel lines 1R, 1L. The current flowing through one-side line 1R is equal to or proportional to the current flowing through the other-side line 1L. Consequently, by controlling the current flowing through the other-side line 1L, the current flowing through the load 50 connected with the one-side line 1R can be controlled. This control is performed in accordance with the first control signal $\Sigma\o1$.

The current $i_1$ flowing in line 1L of first current mirror circuit 1 is determined by the DC component $\o D$ supplied from common partial control circuit 11 within control circuit CONT and the drive signal component $\o1$ supplied from first partial circuit 21. When the first control signal $\Sigma\o1$ becomes drive signal component $\o1$ as a result of addition of drive signal component increment $\Delta\o1$ (negative) to the DC component $\o D$, the first control signal $\Sigma\o1$ becomes small, but since, in this example, we are considering the potential difference from this source to the gate of a transistor of high potential, the voltage obtained by subtracting first control signal $\Sigma\o1$ from the source potential becomes large, so current $i_1$ is increased. Likewise, the currents $i_2$ and $i_3$ flowing in the lines 2L and 3L of the second and third current mirror circuits 2, 3 are determined by the DC component $\o D$ supplied from the common partial control circuit 11 within control circuit CONT and the drive signal components $\o2$, $\o3$ supplied from the second and third partial circuits 31, 41. The operation is the same as in the case of the first current mirror circuit 1.

In other words, the drive current supply circuit of this example is further provided with a second current mirror circuit 2 having at least two parallel lines, the one-side line 2R of the lines of this second current mirror circuit 2 being connected with a load 50; control circuit CONT controls the current flowing through the other-side line (2L) of the lines of second current mirror circuit 2 in accordance with a second control signal $\Sigma\o2$; this second control signal $\Sigma\o2$ consists of a steady DC component $\o D$ and a drive signal component $\o2$ that is added to this DC component when desired.

Likewise, the one-side line 3R of the lines of a third current mirror circuit 3 is connected with a load 50; control circuit CONT controls the current i3 flowing through the other-side line (3L) of the lines of third current mirror circuit 3 in accordance with a third control signal $\Sigma\o3$; this third control signal $\Sigma\o3$ consists of a steady DC component $\o D$ and a drive signal component $\o3$ that is added to this DC component when desired.

Common partial control circuit 11, first partial control circuit 21, second partial control circuit 31 and third partial control circuit 41 are function conversion circuits respectively comprising input terminals (12, 22, 32, 42), control input terminals (13, 23, 33, 43) and output terminals (terminals that supply $\o D$, $\o1$, $\o2$ and $\o3$). The outputs supply $\o D$, $\o1$, $\o2$ and, $\o3$ are expressed by functions of the input to input terminals 12, 22, 32, 43, suitably by a proportionality relationship function. Control inputs 13, 23, 33, 43 input signals that control ON/OFF of the outputs $\o D$, $\o1$, $\o2$ and $\o3$.

In the circuit shown in FIG. 1A, there are provided a plurality of current mirror circuits 2, 3 of the same construction as current mirror circuit 1.

Current mirror circuit 1 is provided with transistors 1QR, 1QL and lines 1R, 1L and is supplied with DC component $\o D$ and drive signal component $\o1$ and current $i_1$ flows in the lines 1L and 1R. In current mirror circuit 2, replacing the 1 of the symbols used in current mirror circuit 1 by 2, there are provided transistors 2QR, 2QL and lines 2R, 2L and it is supplied with DC component $\o D$ and drive signal component $\o2$ and current $i_2$ flows in the lines 2L and 2R.

In current mirror circuit 3, replacing the 1 of the symbols used in current mirror circuit 1 by 3, there are provided transistors 3QR, 3QL and lines 3R, 3L and it is supplied with DC component $\o D$ and drive signal component $\o3$ and current $i_3$ flows in the lines 3L and 3R.

Since the constructions of the second and third current mirror circuits 2 and 3 are the same as the construction of first current mirror circuit 1, hereinbelow, the first current mirror circuit 1 will be described in detail.

Transistors 1QR and 1QL in first current mirror circuit 1 are p-channel field-effect transistors, their sources being connected with +V volt power source potentials 25, 26 and their gates being connected in common. The gate and drain of transistor 1QL are short-circuited so that the gate voltage is controlled by the potential applied to the drain. In the case of p-channel field-effect transistors, the transistor is in ON condition when the voltage between the gate and source is set such that the gate potential is relatively negative with respect to the source.

Consequently, as described above, the current $i_1$ (drive current I) is controlled in accordance with the first control signal Σø1 but, in this example, more precisely, the current $i_1$ is controlled in accordance with the voltage obtained by subtracting the gate (drain) potential Σø1 from the source potential (+V) in transistor 1QL.

Transistors 1QR and 1QL have a threshold voltage at which current starts to flow. This threshold value is set by the voltage between the gate and source in transistor 1QL i.e. by the drain/source voltage.

When greater voltage than or equal to the threshold voltage of transistor 1QL (|V−Σø1|) is applied between the control terminals of the transistor i.e. when it is applied between the gate and source in the field-effect transistor, a current $i_1$ flows in transistor 1QL and the same current I also flows in transistor 1QR which shares this gate, so drive current flows in load 50.

Current mirror circuit 1 may be constituted of bipolar transistors but, with a view to reducing power consumption, is preferably constituted of field-effect transistors. However, if these transistors are bipolar transistors, the source, gate and drain referred to in the context of field-effect transistors may be respectively substituted by emitter, base and collector and in this case the voltage between the aforementioned control terminals therefore becomes the voltage between base and emitter.

The load 50 in this example is a laser diode; this is employed in an optical pickup for reading from a storage medium and writing.

Figure 1C:
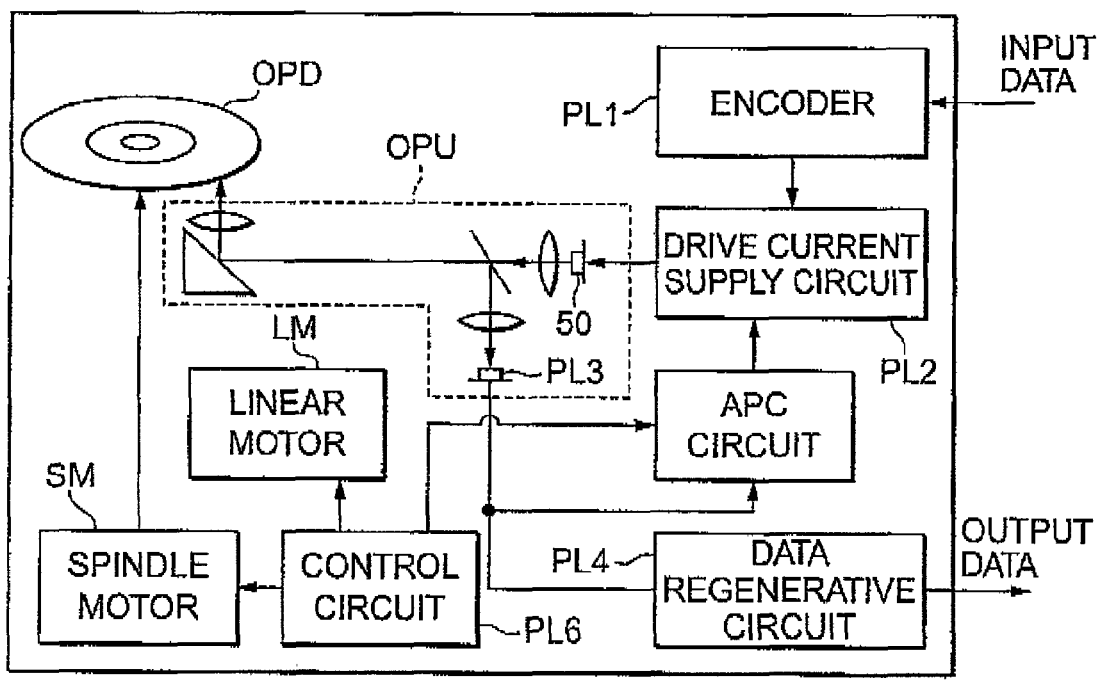
FIG. 1C is a circuit diagram of optical disk player.

FIG. 1C is a circuit diagram of an optical disk player. The input data for writing is encoded by an encoder PL1 such as EFM circuit. The encoded data is applied to for example the control terminal 23 of the drive current supply circuit PL2 shown in FIG. 1A while applying DC voltage to the terminal 13. The load 50, laser diode emits laser light in response to the encoded data.

When the optical disk OPD is illuminated by the laser light beam for writing, a recording layer of the optical disk OPD changes its physical structure and the data is recorded in the optical disk OPD. The reflected laser light beam by the optical disk OPD is detected by a photodiode PL3.

When the optical disk OPD is illuminated by the laser light beam for reading that is modulated by the high frequency, the electric output from the photodiode PL3 is inputted into a data regenerative circuit PL4 and the recorded data is extracted. The electric output is also applied to an auto power control (APC) circuit PL5 that controls the power applied to the laser diode 50. The APC circuit PL5 is controlled by a control circuit PL6. Note that such an APC control is used during writing, too.

The control circuit PL6 also controls a spindle motor SM for rotating the optical disk OPD and a linear motor LM for moving the optical pick-up unit OPU including laser diode 50.

When the photodiode PL3 has multi-divided photosensitive areas, the electrical output from the photodiode PL3 may be used for focusing the laser light beam. This focusing technique is conventional.

The control circuit PL6 decides the laser power by the required physical status of the recording layer when the optical disk is CD-RW. For example, a middle power heating by laser light beam and gradual cooling causes the recording layer to become a crystalline. High power heating and rapid cooling causes the recording layer to become amorphous.

The control circuit PL6 may decide the laser power by the kind of the optical disk OPD because the required laser power differs by the kind of the optical disk.

In this drive current supply circuit shown in FIG. 1A, since the first control signal Σø1 consists of a steady DC component øD and a drive signal component ø1 added to this DC component øD when desired i.e. when writing, from the standpoint of the source, the voltage across the control terminals has already reached a certain negative level because of this DC component øD, so, when drive signal component ø1 is generated by addition of the drive signal component increment Δø1 thereto, its rise time in the negative direction is shortened. In terms of potential, since the potential of the DC component øD is lower than +V, the potential of the drive current component ø1 is lower than the DC component øD.

Figure 2:
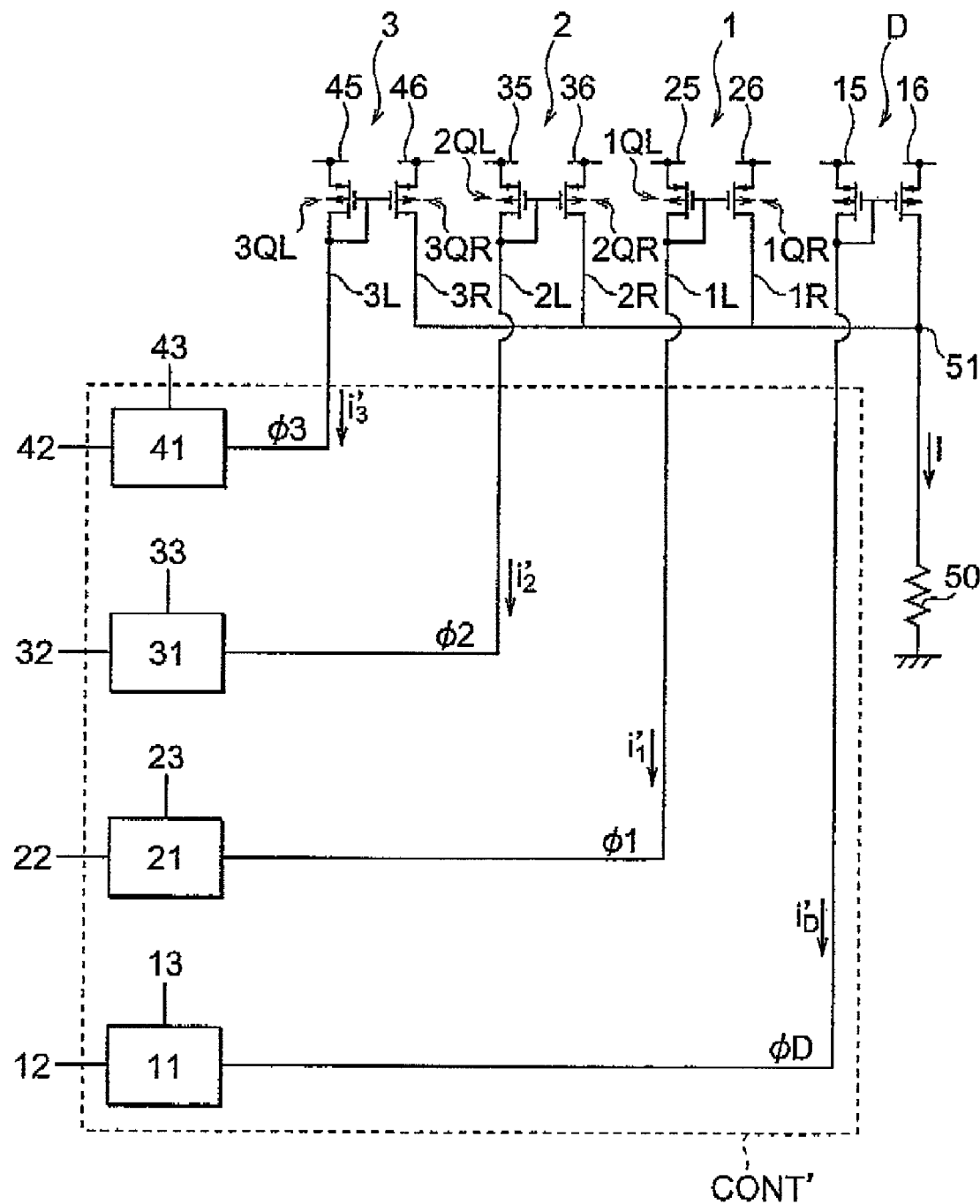
FIG. 2 is a circuit diagram of a drive current supply circuit wherein the conventional circuit is somewhat improved.

For example, if +V is set at 5 V, the DC component øD is chosen to be 4 V, and the center of amplitude of the drive signal component ø1 constituting the pulse signal is set at 2.5 V. In the case of the drive signal component ø1 only, in order to cause a current $i_1'$ as shown in FIG. 2, to be described, to pass, ø1 must be lowered from 5 V to 2.5 V; thus, regarding the difference of these as the gate/source voltage, from the standpoint of the source, a voltage of −2.5 V must be applied to the gate.

If, as in the case of the circuit shown in FIG. 1A, a potential of for example 4 V is applied beforehand to the gate as øD, from the standpoint of the source, a voltage or −2.5 V can be applied to the gate simply by lowering ø1 from 4 V to 2.5 V. Since stray capacitance is of course present between the gate and source of the transistor, when the voltage between the gate and source is changed, some time is required for charging/discharging of this capacitance. Therefore, an excellent response characteristic of the output current can be obtained by making the change of the voltage between the gate and source small.

Although, in the drawing, a resistance R1 is inserted on a line connecting the line that supplies ø1 and the line that supplies øD, this resistance could be inserted in partial control circuit 11.

The level to which the voltage between the control terminals should be raised is determined as needed by DC component øD. This drive current supply circuit, when employed for reading and writing by an optical pickup, in the case of reading, sets DC component øD of at or above the threshold voltage of transistor 1QL so that normally drive current I flows; in the case of writing, it adds an increment thereto, replacing it with drive signal component ø1; thus a voltage of at or above the threshold voltage of transistor 1QL is of course set between the control terminals, so that, in the case of writing, a large current flows to load 50 i.e. the laser diode through one side of the parallel lines in the current mirror circuit 1.

It should be noted that this threshold voltage is set lower than the voltage that applies a threshold value of drive current I that produces oscillation of laser diode (50).

The word "steady" means a continuous period in which there is no change whether in the reading period or in the writing period; it does not mean that the DC component does not change when the power source of the drive current supply circuit itself is OFF or when other control is being performed.

As described above, this drive current supply circuit can be utilized in an optical pickup when the load 50 is a laser diode.

Referring to the first current mirror circuit 1, first current mirror circuit 1 comprises two field-effect transistors 1QR, 1QL with their gates connected in common, the one-side channel of the field-effect transistors being designated as the one-side line (1R), the other-side channel of the field-effect transistors being designated as the other-side line (1L), the DC voltage øD that is applied to the gate being designated as the DC component of the first control signal, and the drive voltage ø1 that is applied to the gate being designated as the drive signal of the first control signal. Control circuit CONT applies the DC voltage and the drive voltage to the gate.

When a voltage is applied between the gate and source in field-effect transistor 1QL i.e. when DC voltage øD and drive voltage ø1 are applied by control circuit CONT, since the current $i_1$ flowing through the other-side line 1L of current mirror circuit 1 changes depending on this first control signal Σø1, the first control signal Σø1 being set, as described above, so that the rise in the case of writing is speeded up, the rise of the drive current I supplied to load 50 is speeded up.

It should be noted that the DC component øD is supplied from common partial control circuit 11 to each of the lines 1L, 2L, 3L and, if required, resistances R1, R2, R3 may be inserted as shown in the Figure on each line.

A node 51 is formed by connection of all of 1R, 2R, 3R on one side of the parallel lines of the respective current mirror circuits 1, 2, 3. Load 50 is connected to node 51, so the currents $i_1$, $i_2$, $i_3$ flowing through the other sides 1L, 2L, 3L of the parallel lines of each of the current mirror circuits 1, 2, 3 are added i.e. the currents $i_1$, $i_2$, $i_3$ flowing through the one-side lines 1R, 2R, 3R are added and supplied to load 50 as drive current I.

Since the currents flowing through the other sides 1L, 2L, 3L of the parallel lines of each of the current mirror circuits 1, 2, 3 are individually controlled by control circuit CONT, the current I flowing to load 50 can be controlled as the sum of these.

It should be noted that, in the prior art control circuit, the control signals supplied to the specified lines in a single current mirror circuit consisted solely of a DC component in the case of reading and consisted solely of an AC component modulated by the write information in the case of writing.

FIG. 2 is a circuit diagram of a case in which this prior art circuit is somewhat improved. For the structural elements in FIG. 2 the same symbols are employed as in the case of FIG. 1A, so detailed description thereof is omitted, but their connection relationship differs as shown. This circuit employs a plurality of current mirror circuits 1, 2, 3, D; current mirror circuit D that is supplied solely with DC component øD when reading is performed and current mirror circuits 1, 2, 3 that are supplied solely with AC components modulated by the write information when writing is performed are independently provided; drive current I to load 50 is constituted by adding the output currents $i_1'$, $i_2'$, $i_3'$, $i_D'$ these current mirror circuits 1, 2, 3, D.

In a circuit as shown in FIG. 2 also, when control circuit CONT' controls the current $i_1'$ flowing through the parallel lines of a specified current mirror circuit 1 in accordance with drive signal component ø1 consisting solely of an AC signal during performance of writing, directing attention to the specified current mirror circuit 1 that is supplied with this drive signal component, from the point of view of the source, the voltage between the control terminals (gate and source) starts to rise in the negative direction from 0 V and, exceeding this threshold voltage, attains a desired voltage level. Consequently, in comparison with the embodiment described above, the speed of rise in a circuit constructed as above is slow.

The principle whereby the rise as described above is speeded up will now be described in detail.

Figure 3:
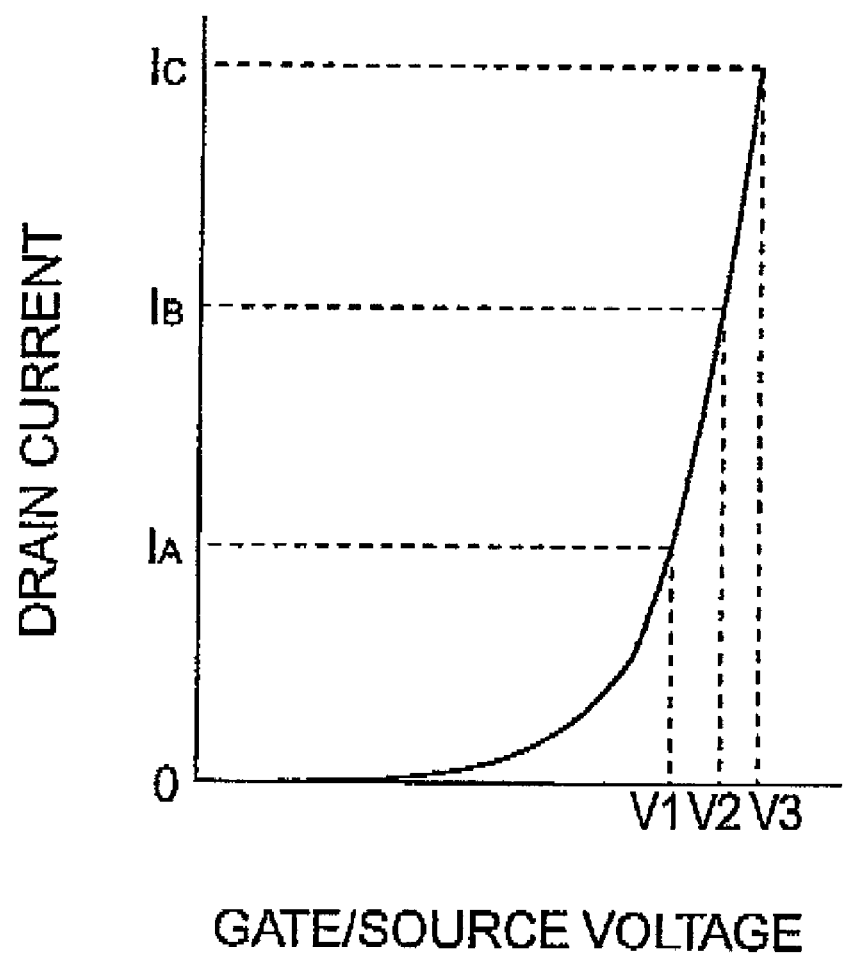
FIG. 3 is a graph showing the relationship of gate/source voltage (gate voltage) and drain current in a field-effect transistor.

FIG. 3 is a graph showing the relationship between the gate/source voltage (gate voltage) and the drain current in a field-effect transistor.

The drain currents $I_A$, $I_B$, $I_C$ ($=I_A+I_B$) increase monotonically in proportion to the gate voltages V1, V2, V3. As in the case of the circuit shown in FIG. 2, when individual gate voltages V1, V2 are applied to the transistors in the individual current mirror circuits D, 1, when writing, drive current $I=I_C=I_A(i_D')+I_B(i_1')$ can be obtained as the sum of the drain currents, but, in order to obtain current $I_B$ ($i_1'$), the gate voltage must be increased from 0 V to V2.

In contrast, in a drive current supply circuit according to the embodiment described above, since gate voltage V1 (V−øD) is already applied to the gate of transistor 1QL in a single current mirror circuit 1, when writing, in order to obtain a current $I_C$ ($i_1$) by adding V3 (V−Σø1 (=V−ø1)), it suffices merely to raise the gate voltage front V1 to V3, so a speeding up can be achieved.

Figure 4:
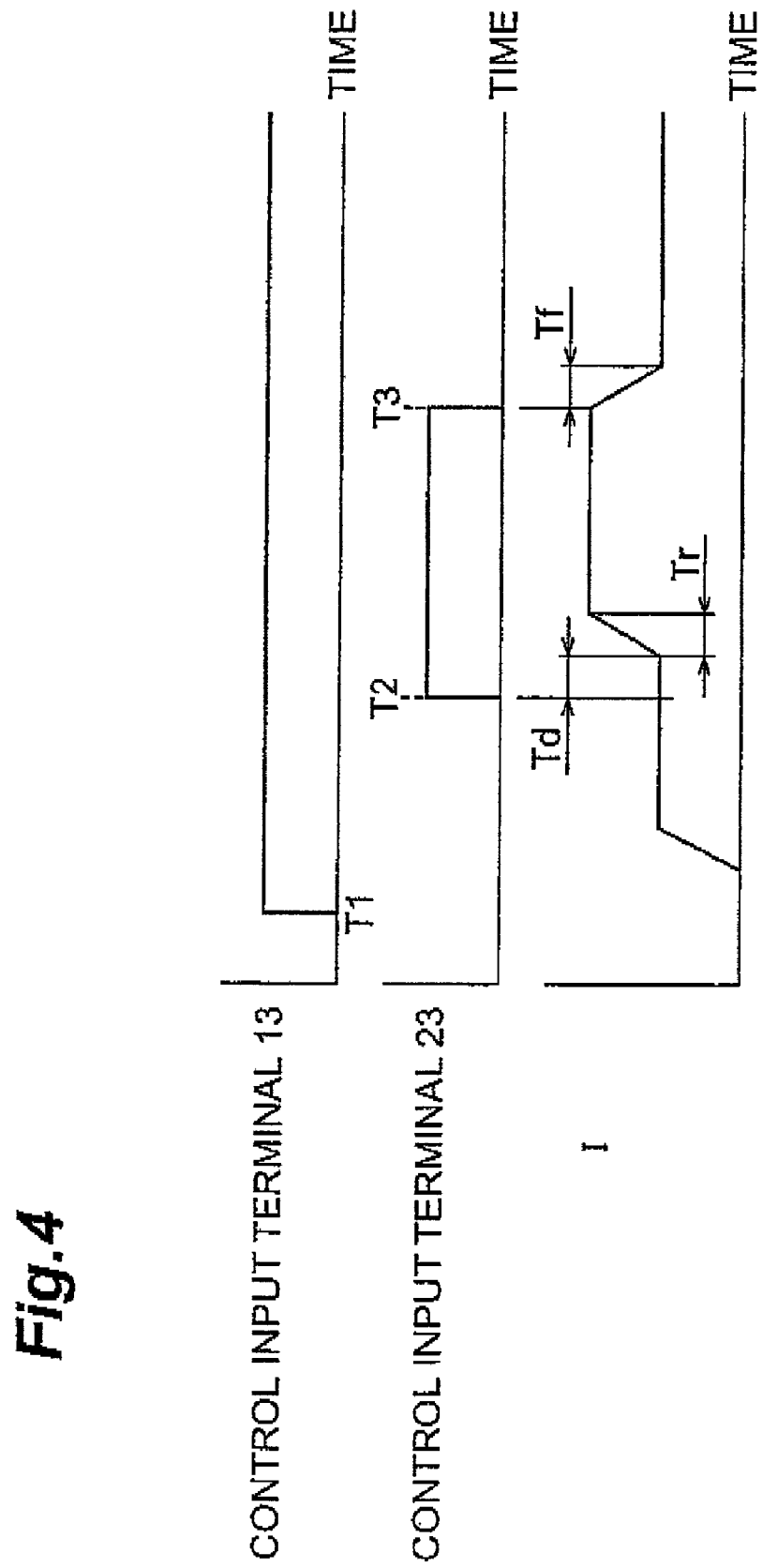
FIG. 4 is a timing chart in the circuit of FIG. 2.

FIG. 4 is a timing chart in the circuit of FIG. 2.

In the circuit shown in FIG. 2, during reading etc, DC current øD is applied steadily from time-point T1 (input to control input terminal 13=H) and in a desired period such as during writing (time-point T2 to T3), drive signal component ø1 is applied (input to control input terminal 23=H). In this case, after time-point T2, the period Td before the drive current starts to rise, the period Tr in which it has risen, and the period Tf of falling after time-point T3 are comparatively long.

Figure 5:
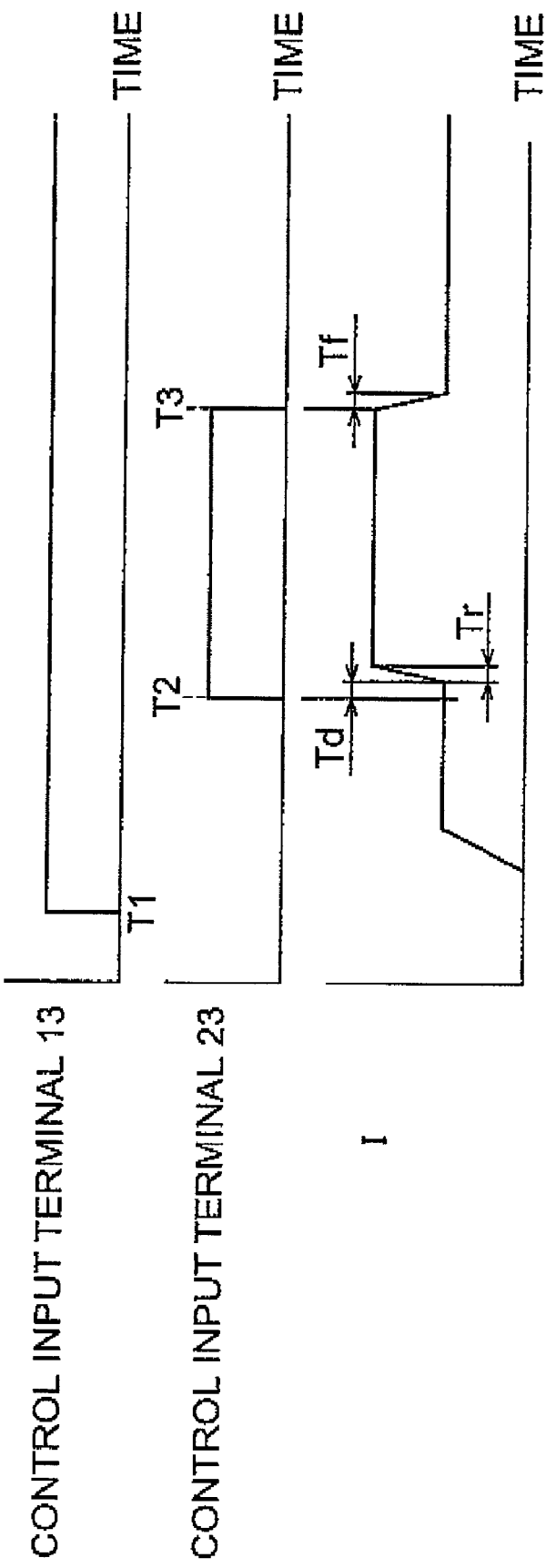
FIG. 5 is a timing chart in the circuit of FIG. 1.

FIG. 5 is a timing chart in the circuit of FIG. 1A.

In contrast, in the circuit shown in FIG. 1A, during reading etc, DC current øD is applied steadily from time-point T1 (input to control input terminal 13=H) and in a desired period such as during writing (time-point T2 to T3), drive signal component ø1 is applied (input to control input terminal 23=H). But in this case, after time-point T2, the period Td before the drive current starts to rise, the period Tr in which it has risen, and the period Tf of falling after time-point T3 are all comparatively shorter than the periods shown in FIG. 4, so high-speed rising and falling can be achieved.

Thus, when an optical pickup is employed that uses the circuit described above in a writable optical disc, the timing of writing can be such that this is performed continuously with the condition in which the disc was being read, when the optical disc is rotating, a condition is thereby produced in which the current for generating the laser beam for reading is always flowing. A condition in which control input terminal 13 is placed beforehand in ON condition so that a steady DC drive current I flows is often employed in actual optical pickups. With the use of higher speeds of writing in writing information to disks, the response characteristic of the laser beam is important; if the drive current supply circuit of the embodiment described above is employed, rise of the laser diode constituting load 50 can be achieved rapidly, so, in an optical pickup in which reading and writing are performed frequently, the writing speed can be increased.

Although, in the above, three current mirror circuits were employed, these could be four or more and although the output current of the current mirror circuits in each stage were equally divided, they could be different.

As described above, with the drive current supply device of the present invention, the speed of rise of the drive current to the laser diode constituting the load can be increased.

What is claimed is:

1. A drive current supply circuit for supplying drive current to a laser diode used for reading data from and writing data on an optical disk, comprising:
    a first current mirror circuit having two parallel lines, said laser diode being connected with one of the two parallel lines; and
    a control circuit connected with the other of the two parallel lines, said control circuit controlling the current flowing in this line in accordance with a potential of this line,
    this potential comprising a steady DC component when reading data; and
    this potential comprising a drive signal component added to said DC component when writing data,
    wherein an amount of variation of the potential to reach the drive signal component is smaller, and the rise time is shorter, than a variation of the potential that consists solely of an AC component.

2. The drive current supply circuit according to claim 1,
    wherein said first current mirror circuit comprises first and second field-effect transistors with their gates connected in common,
    wherein the channel of said first field-effect transistor is said one of said lines, and
    wherein the channel of said second field-effect transistor is said other of said lines.

3. The drive current supply circuit according to claim 1, further comprising a second current mirror circuit having two parallel lines, one of said lines of said second current mirror circuit being connected with said laser diode,
    wherein said control circuit controls the current flowing through the other of said lines of said second current mirror circuit in accordance with a potential of the other of said lines, this potential comprising a steady DC component when reading data; and this potential comprising a drive signal component added to said DC component when writing data.

* * * * *